United States Patent [19]

Suzuki et al.

[11] Patent Number: 5,171,965
[45] Date of Patent: Dec. 15, 1992

[54] EXPOSURE METHOD AND APPARATUS

[75] Inventors: Akiyoshi Suzuki; Hiroshi Echizen, both of Tokyo, Japan

[73] Assignee: Canon Kabushiki Kaisha, Tokyo, Japan

[21] Appl. No.: 811,915

[22] Filed: Dec. 23, 1991

Related U.S. Application Data

[63] Continuation of Ser. No. 233,964, Aug. 16, 1988, abandoned, which is a continuation-in-part of Ser. No. 102,809, Sep. 22, 1987, abandoned, which is a continuation of Ser. No. 693,466, Jan. 22, 1985, abandoned, and a continuation-in-part of Ser. No. 104,583, Oct. 2, 1987, abandoned, which is a continuation of Ser. No. 14,141, Feb. 12, 1987, abandoned, which is a continuation of Ser. No. 700,967, Feb. 12, 1985, abandoned.

[30] Foreign Application Priority Data

| Feb. 1, 1984 | [JP] | Japan | 59-15044 |
| Dec. 27, 1984 | [JP] | Japan | 59-275751 |
| Jan. 12, 1985 | [JP] | Japan | 60-3783 |

[51] Int. Cl.$^5$ .................. B23K 26/00; G03B 27/27
[52] U.S. Cl. .................. 219/121.6; 219/121.83; 219/121.62; 219/121.85; 250/492.1; 250/492.2
[58] Field of Search ........... 219/121.6, 121.61, 121.62, 219/121.68, 161.69, 121.85, 121.2; 250/492.1, 492.2; 340/555, 552; 315/241 P

[56] References Cited

U.S. PATENT DOCUMENTS

| 3,441,346 | 4/1969 | Naidich et al. | 355/77 |
| 3,494,695 | 2/1970 | Sollima et al. | 355/41 |
| 3,566,763 | 3/1971 | Knopf | 354/4 |
| 3,806,829 | 4/1974 | Duston et al. | 219/121 LB |
| 3,985,440 | 10/1976 | Dennhardt et al. | 355/68 |
| 4,095,891 | 6/1978 | Lovering | 355/50 |
| 4,255,046 | 3/1981 | Corona | 355/68 |
| 4,551,011 | 11/1985 | Yuasa | 355/35 |
| 4,556,875 | 12/1985 | Ishiwatari | 219/121 LB |
| 4,560,856 | 12/1985 | Miller et al. | 219/121 LB |
| 4,580,557 | 4/1986 | Hertzmann | 219/121 LZ |
| 4,703,166 | 10/1987 | Bruning | 250/201 |

FOREIGN PATENT DOCUMENTS

| 0066053 | 12/1982 | European Pat. Off. |
| 0103021 | 3/1984 | European Pat. Off. |
| 3318978 | 11/1984 | Fed. Rep. of Germany |
| 2519156 | 7/1983 | France |
| 83-02171 | 6/1983 | PCT Int'l Appl. |
| WO8600427 | 1/1986 | PCT Int'l Appl. |

OTHER PUBLICATIONS

Jain, K, Willson, C. G., Lin, B. J., "Ultrafast Deep UV Lithography with Eximer Lasers", IEEE Electron Device Letters, vol. EDC-3, No. 3, Mar. 1982, pp. 53–55.

Schefter, "Square Blue Laser Focuses Ultraviolet Energy", Popular Science, May 1983, pp. 1 to 2.

Kuchling, "Standard Deviation of the Sample Average", Pocketbook of Physics, 1978, pp. 573 through 574.

Primary Examiner—Mark H. Paschall
Attorney, Agent, or Firm—Fitzpatrick, Cella, Harper & Scinto

[57] ABSTRACT

A method and an apparatus for exposing an object with a pulsed laser beam. The exposure of one shot (one exposure area) is achieved by a plurality of pulse exposures with laser light in a corresponding number of pulses, as the result of which any fluctuations or errors in the outputs of the pulses are substantially compensated so that correct exposure of each shot is assured. In another aspect, the amounts of exposures by the plural pulses for the one shot exposure are integrated and the integrated amount of exposure is compared with a correct or desired amount of exposure. On the basis of the result of comparison, an additional pulse exposure is effected in accordance with the degree of under exposure.

77 Claims, 4 Drawing Sheets

EXPOSURE METHOD AND APPARATUS

This application is a continuation of prior application Ser. No. 07/233,964 filed Aug. 16, 1988, which application is a continuation-in-part of prior application Ser. No. 07/102,809 filed Sep. 22, 1987, which application is a continuation prior application Ser. No. 06/693,466 filed Jan. 22, 1985; and a continuation-in-part of prior application Ser. No. 07/104,583 filed Oct. 2, 1987, which application is a continuation of prior application Ser. No. 07/014,141 filed Feb. 12, 1987, which application is a continuation of prior application Ser. No. 06/700,967 filed Feb. 12, 1985, all now abandoned.

BACKGROUND OF THE INVENTION

This invention relates to an exposure method and an exposure apparatus, and, more particularly, it relates to exposure method and apparatus for the manufacture of semiconductor circuit devices.

Recent development in semiconductor technology has resulted in higher capacities and further miniaturization of semiconductor circuit devices. Along with such trend, photolithography techniques such as an optical exposure process have become more and more dominant with the development of high resolution lenses. In such exposure systems, a short wavelength of light within the deep UV range has recently been used to transfer and print a circuit pattern of a mask or reticle onto a wafer. This is because the resolution for the minimum line width of the circuit pattern to be printed on the wafer is proportional to the wavelength of the light.

Conventionally, heavy hydrogen lamps or Xe-Hg lamps have been used as the deep UV light sources. These lamps provide continuous emission in both cases of DC energization and AC energization. In view of such feature, the amount of exposure for the wafer has been achieved by analog-like control systems such as, for example, a timer control system for controlling the exposure time by means of a timer, or an integrating exposure-meter system in which the amount of exposure is integrated and the exposure is continued until the integrated exposure reaches a predetermined value.

Use of such light sources, however, involves inconveniences, because only a decreased output is obtainable in the deep UV range and the sensitivity of the photoresist material applied to the wafer surface is low. This results in a longer exposure time and a decreased throughput.

It has recently been found that a high-power and high-luminance laser oscillatingly emitting a beam in a short wavelength region (deep UV region) is effective to be applied to the exposure apparatus. An example of such laser is an excimer laser. The excimer laser intermittently emits a laser beam at the repetition-frequency of approx. 200-300 Hz. The emission time (the duration of each pulse) is about 10-30 nsec. Because of the high power of the excimer laser, only one pulse emission is usually required to provide a sufficient amount of exposure relative to an ordinary resist material. Therefore, the exposure time of the order of 0.01 sec. is attainable.

However, the pulse energy of the excimer laser contains fluctuation of about ±5%. This pulse energy fluctuation directly leads to irregularity in the exposure energy to be applied to chip areas on the wafer. The irregular exposure produces serious effects on the resolving power and the reproducibility of line width after development of the resist material and, therefore, decreases yield of chips. However, the excimer laser is a pulse-oscillation type laser, as compared with the conventional heavy hydrogen lamps or Xe-Hg lamps. For this reason, the above-described analog-like control system for controlling the amount of exposure could not be used, as it is, in exposure apparatuses employing excimer lasers.

SUMMARY OF THE INVENTION

It is accordingly a primary object of the present invention to provide a method and an apparatus for performing exposure with a pulsed laser beam, in which a correct amount of exposure can be easily attainable.

It is another object of the present invention to provide a method and an apparatus for performing exposure with the pulsed laser beam, in which the amount of exposure can be very easily and positively controlled.

Briefly, according to the present invention, there are provided a method and an apparatus for exposing an object with a pulsed laser beam. The exposure of one shot (one exposure area) is achieved by a plurality of pulse exposures with the corresponding number of pulses, as the result of which any fluctuations or errors in the outputs of the pulses are substantially compensated so that correct exposure of each shot is assured. In another aspect, the amounts of exposures by the plural pulses for the one shot exposure are integrated and the integrated amount of exposure is compared with a correct or desired amount of exposure. On the basis of the result of comparison, an additional pulse exposure is effected in accordance with the degree of under exposure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 9 is a schematic and diagrammatic view showing a projection type exposure apparatus according to an embodiment of the present invention.

FIG. 10 is a schematic and diagrammatic view showing a proximity type exposure apparatus according to another embodiment of the present invention.

FIGS. 11 and 12 are schematic views, respectively, showing the magnitude relation between the energy for correct exposure and the pulse energy for the combined coarse and fine exposure according to the present invention.

FIG. 13 is a schematic and diagrammatic view showing a step-and-repeat type exposure apparatus according to a further embodiment of the present invention.

FIGS. 14 and 15 are schematic views, respectively, showing examples of a combined coarse and fine exposure according to the present invention.

DESCRIPTION OF THE PREFERRED EMBODIMENTS

Figure 1:
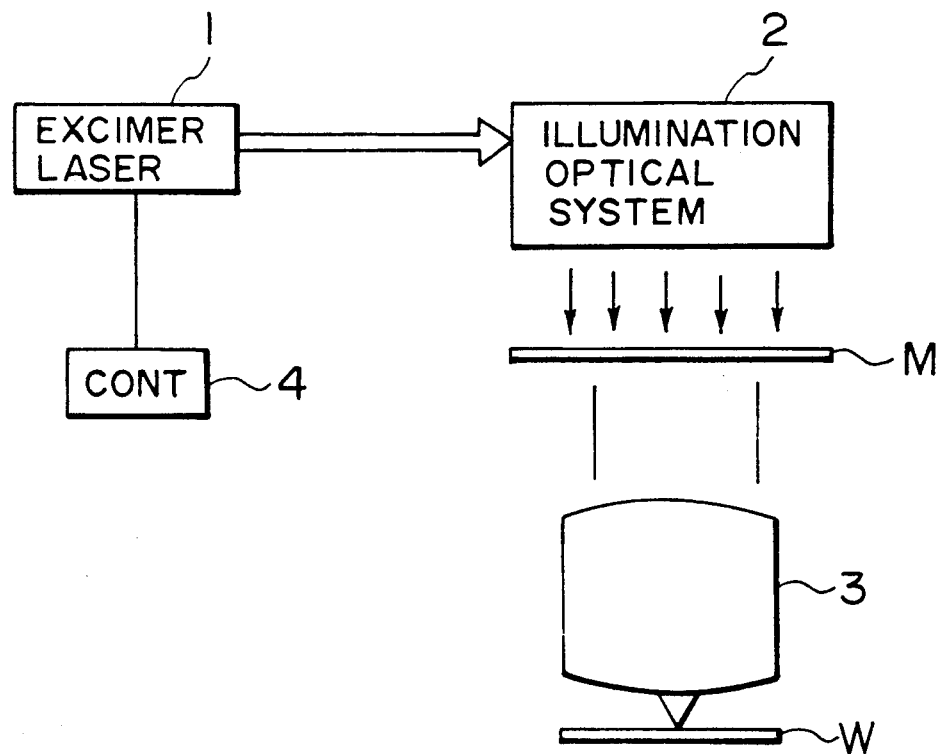
FIG. 1 is a schematic and diagrammatic view showing an exposure apparatus, of the reduction projection type, in accordance with an embodiment of the present invention.

FIG. 1 shows an embodiment of the present invention which is incorporated in an exposure apparatus of the reduction projection type, called a stepper. The exposure apparatus includes a light source 1, such as an excimer laser, providing a pulsed laser beam. Within the light source 1, a gas of, e.g., KrF or XeCl is contained and sealed, so that a wavelength of light in the deep UV range such as 248 nm (in the case of KrF gas) or 308 nm (in the case of XeCl gas) is emitted in the form of pulses.

Figure 2:
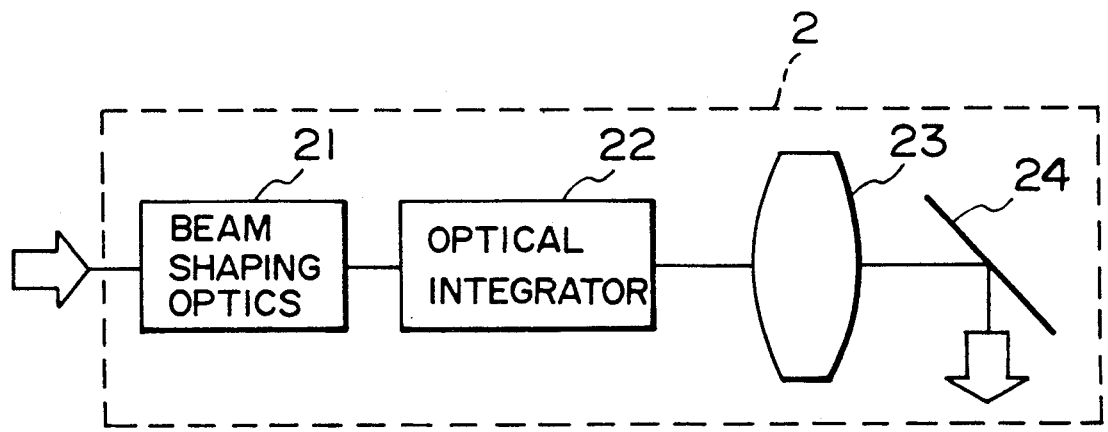
FIG. 2 is a schematic and diagrammatic view showing an illumination optical system of the exposure apparatus shown in FIG. 1.

The laser beam emitted by the light source 1 enters into an illumination optical system 2, the details of which are illustrated in FIG. 2. The illumination optical system 2 includes a beam shaping optical system 21 such as a toric lens, an optical integrator 22 such as a compound-eye lens, a collimator lens 23 and a mirror 24. Each of the optical systems 21-23 are made of a material such as $SiO_2$, $CaF_2$ or the like which is transmissive to the light of deep UV range. Commercially available excimer lasers usually provide a beam of oblong cross-sectional shape. In view of this, the beam shaping optical system 21 is provided to suitably shape the laser beam, e.g. into a square shape. The optical integrator 22 is provided to achieve uniform distribution of light.

Referring now back to FIG. 1, a reticle or mask M having formed thereon an integrated circuit pattern, a projection optical system 3 and a wafer W are disposed, in the named order, along the optical path defined by the illumination optical system 2. Similarly to the illumination optical system 2, the projection optical system 3 is made of a material which is transmissive to the light of deep UV range. The reduction projection may, of course, be achieved by a reflection imaging system, in place of the projection lens system.

Designated by reference numeral 4 is a control unit for controlling the pulse output of the excimer laser 1. In this laser output control unit 4, the output of each pulse to be provided by the excimer laser 1 can be variably preset.

As described in the foregoing, the excimer laser is capable of providing a higher output. For this reason, only one pulse exposure can provide a sufficient amount of exposure relative to one shot. Thus, the exposure process can be effected by, one pulse emission for each shot. However, it is known that the outputs of the pulses generated by the excimer laser involve fluctuations or errors in the range of ±5% or more. Such fluctuations in the outputs of the pulses would result in irregularities in the amounts of exposures. Therefore, the one pulse exposure per one shot would not easily ensure a correct exposure for each shot and uniform exposures relative to plural shots.

The above-described problem can be solved by the present invention. Briefly stated, the present invention aims at deleting or suppressing incorrect or uneven exposure which will be otherwise caused by the fluctuations in the outputs of the pulses, without correcting the fluctuations themselves of the outputs of the pulses. In summary, the present invention is based on the following finding made by the inventor.

That is, in the case of one pulse exposure per one shot exposure, ±5% fluctuation or error in the output of each pulse would directly lead to ±5% error in the amount of exposure. As compared therewith, if the exposure of one shot is effected by two or more pulses, the probability that the total amount of exposure by these plural pulse exposures becomes 5% over (the maximum error) relative to the correct amount of exposure is remarkably decreased. This is because the total amount of exposure becomes 5% over only when each of the pulses has provided the maximum over-exposure (5% over). On the other hand, there is a substantial probability that the plural time pulse exposures cancel the errors with each other.

According to the present invention, on the basis of such finding, the output of each pulse to be generated by the excimer laser 1 is controlled by the laser output control unit 4 so that an output, suitable to provide an amount of exposure which is smaller than the correct amount of exposure for one shot, is preset for each of the pulses, and the exposure of one shot is effected by a plurality of pulse exposures by the corresponding number of pulses each having the preset output as aforesaid. The term "preset output" means an expected average value of the pulse outputs which will be actually generated by the excimer laser 1 if a fixed value is continuously input to the excimer laser 1. That is, in view of the fact that each pulse output from the excimer laser involves an error or fluctuation in the range of approx. ±5%, an expected average value of the pulse outputs which will be actually generated by the excimer laser 1, with respect to a particular input value, is specified at the laser output control unit 4. In this sense, the "preset output" can be expressed as a "specified output" or a "target output". In accordance with the present invention, stated strictly, the exposure of one shot is effected by a plurality of pulse exposures with the corresponding number of pulses each containing an error in its output. Nevertheless, the errors in the pulse outputs are substantially compensated for, as a result of the plural pulse exposures. Accordingly, it is not necessary to provide any specific control means for correcting the fluctuation in the quantity of pulsed laser beam.

As a convenient way of achieving this result, the outputs of the plural pulses for the exposure of one shot are preset at the same value. In other words, when the number of pulse exposures for one shot is N, the output of each pulse is preset at a value suitable to provide an amount of exposure which is equal to or substantially equal to 1/N of the correct amount of exposure.

Commecially available excimer lasers generally have a high emission-repetition frequency on the order of 200-300 Hz. For this reason, the plural pulse exposures per one shot still improve the throughput, as compared with conventional exposure apparatuses. For example, in a case where an average of ten (10) pulse exposures are effected for each shot and even if the number of pulse exposures varies within a range from nine (9) to eleven (11) due to the errors in the pulse outputs, the required exposure time will be within a range of 0.04-0.05 sec. This is a striking contradistinction to conventional steppers which generally require approx. 0.3 sec. exposure time. Thus, the exposure time required by the plural pulse exposures is shortened to a value which is smaller, by one order of magnitude, than that required by conventional steppers. Therefore, both the stabilized exposure and improved throughput are assured. Even if the exposure of one shot is effected by twenty (20) pulses, the exposure will be completed within approx. 0.1 sec., which is a significant improvement over conventional exposure apparatuses.

In this specification, the term "one shot" means the exposure which is enough to expose the whole surface of the wafer in a case of global or whole-surface exposure; the exposure which is enough to expose one chip in a case of step-and-repeat type exposure wherein the exposure operation is effected for each chip; and the exposure which is enough to expose one slit width in a case of slit exposure.

While in the FIG. 1 embodiment the invention has been described with reference to the lens projection type exposure apparatus, the invention is not limited thereto and it is applicable to a contact type or proximity type exposure apparatus.

In accordance with the present invention, as has hitherto been described, the exposure of one shot is effected by a plurality of pulse exposures with the pulsed laser beam. By this invention, in spite of the strikingly different feature of the pulsed laser beam as compared with the continuous emission of conventional light sources, stable exposure is ensured without using any specific control means. Moreover, the throughput is improved.

Figure 3:
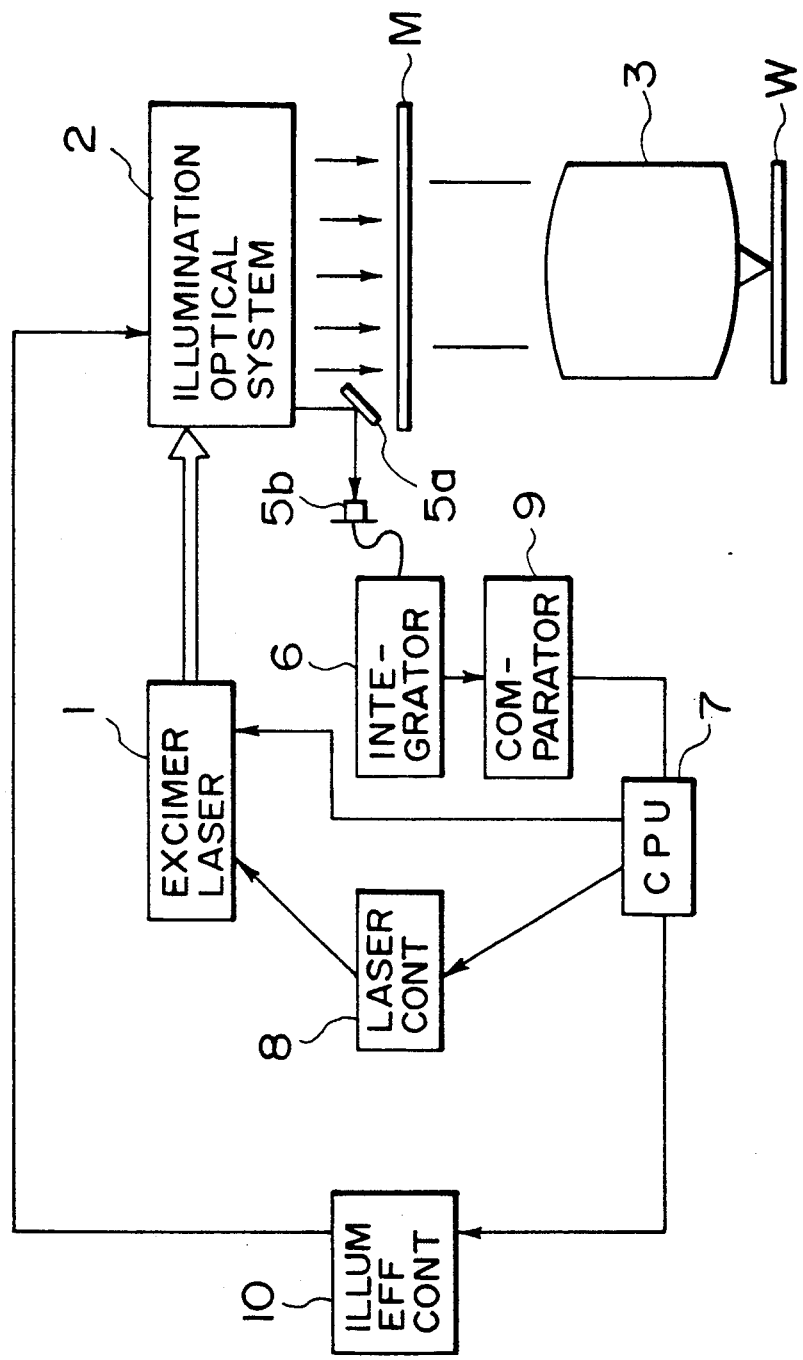
FIG. 3 is a schematic and diagrammatic view showing an exposure apparatus, of a reduction projection type, in accordance with another embodiment of the present invention.

FIG. 3 shows another embodiment of the present invention which is incorporated in a reduction projection type exposure apparatus, called a stepper, with the elements corresponding to those of the FIG. 1 embodiment being designated by the same reference numerals. The exposure apparatus includes a light source 1 such as an excimer laser, an illumination optical system 2 and a projection optical system 3, all of which may be the same as those of the FIG. 1 embodiment. Further, a reticle or mask M and a wafer W may be the same as those shown in FIG. 1. Therefore, descriptions thereof will be omitted here for the sake of simplicity of explanation.

Essentially, the FIG. 3 embodiment differs from the FIG. 1 embodiment in the following points.

In the present embodiment, in addition to effecting a plurality of pulse exposures for each shot, the amounts of pulse exposures are integrated and the integrated total amount of exposure is compared with a correct amount of exposure for one shot. On the basis of the result of comparison, addition of further pulse exposure is controlled, whereby the amount of exposure for each shot is more strictly and precisely controlled.

As shown in FIG. 3, a mirror 5a is disposed in the optical path defined by the illumination optical system 2 and a UV photosensor 5b is disposed in the optical path defined by the light beam reflected by the mirror 5a. The photosensor 5b may be disposed near the laser light source 1 or in the optical path extending from the light source 1 to the wafer W. In response to reception of light, the photosensor 5b generates an output which is supplied to a light quantity integration circuit 6 into which the sensitivity of the photoresist has been previously input. Within the integration circuit 6, the amounts of exposures by the pulses from the excimer laser 1 are sequentially integrated. The integrated total amount of exposure is then compared with the correct amount of exposure at a comparator circuit 9. Subsequently, the result of comparison is input to a central processing unit 7. On the basis of the result of comparison at the comparator circuit 9, the central processing unit 7 computes the number of pulses and/or the output of each pulse necessary for sufficiently exposing the photoresist material on the wafer W. The result of computation is then supplied to a laser output control unit 8 which is adapted to drive the excimer laser 1 in accordance with the result of computation at the central processing unit 7, whereby the pattern of the mask M is irradiated by the pulses of the number and/or outputs controlled as required. By this arrangement, the mask pattern is printed on the wafer W surface.

If necessary, the efficiency of the illumination optical system (e.g., the diameter of the laser beam, quantity, etc.) may be controlled by an illumination efficiency controlling unit 10 in accordance with the result of computation at the central processing unit 7. Further, the output of each pulse can be controlled by one of or both of the laser output control unit 8 and the illumination efficiency controlling unit 10.

Operation of the present embodiment will now be described with reference to the flow chart shown in FIG. 4.

As has already been described with reference to the FIG. 1 embodiment, the plural-pulse exposure for each shot is effective to substantially compensate for the fluctuations or errors in the pulse outputs and assures stable control for the amount of exposure. In the present embodiment, in addition to such plural-pulse exposure, the amount of plural-pulse exposure is integrated, in real time, and the integrated amount of exposure is compared with the correct amount of exposure. If the result of comparison shows underexposure, addition of further pulse exposure is effected in accordance with the amount or degree of "under or under-exposure".

Figure 5:
FIGS. 5-8 waveforms as examples of pulse control.

For example, "n" times of pulse exposures are effected by n pulses each having the same preset output, while the amount of exposure is monitored by the integration circuit 6. Alternatively, "m" times of pulse exposures, which are effective to achieve the required amount of exposure provided that the maximum errors (e.g., +5%) in the outputs are accumulated, are effected by using m pulses each having the same preset output, and subsequently, the total amount of exposure is monitored by the integration circuit 6. The integrated amount of exposure by the n or m times of pulse exposures is compared with the correct amount of exposure at the comparator circuit 9. If the difference therebetween is within a predetermined permissible range, the exposure is completed. If, on the other hand, the result of comparison shows a substantial deficiency in the amount of exposure, additional exposure is effected using one or plural additional pulses in accordance with the deficiency, such as shown in FIG. 5. The number of such additional pulses is determined so as to minimize the difference between the correct amount of exposure and the final amount of exposure, i.e. to minimize the degree of under-exposure or over-exposure.

Even if the total amount of exposure which is finally determined by the final pulse exposure becomes "under" or "over" relative to the correct amount of exposure, the difference therebetween can be remarkably reduced in contrast with the one shot/one pulse exposure.

If, for any reason, the correct amount of exposure is reached by one or such a number of pulse exposures which is smaller than n or m as aforesaid, the exposure operation is, of course, completed at that time.

Figure 6:

In a case where the output of each pulse is further decreased and the number of pulses for each shot is accordingly increased, such as shown in FIG. 6, an amount of exposure which is very close to the correct amount of exposure is attainable. This is because the preset output of each pulse is decreased so that the absolute fluctuation or deviation of each pulse output is smaller even if the last one or ones of the pulses involve +5% error.

The pulse output can be decreased by decreasing the output of the laser light source itself, as described in the foregoing. Alternatively, the pulse output may be decreased by using an ND filter disposed in the optical path of the laser light source or by changing the efficiency of the illumination optical system. The latter may be assured by reducing the diameter of the illumination light. As a further alternative, the output of the laser light source may be primarily adjusted while the efficiency of the illumination optical system may be adjusted supplementarily.

Figure 7:
Figure 8:

While, in the examples shown in FIGS. 5 and 6, the additional pulse exposure according to the degree of under-exposure is effected by controlling the number of additional pulses, such pulse number control may be replaced by or combined with the control of the preset output of the additional pulse. More specifically, the amount of exposure by the above-described n or m times of pulse exposures is compared with the correct amount of exposure and, if under-exposure occurs, the additional pulse exposure is effected by an additional pulse having a preset output which is controlled in accordance with the deficiency in the amount of exposure, such as shown in FIG. 7. In such case, the preset output of the last pulse, i.e. the additional pulse, is made lower (the case of FIG. 7) or higher than those of the preceding pulses, in accordance with the degree of under-exposure. The addition of pulse exposure may be achieved by using a plurality of additional pulses, as described in the foregoing. In such case, the additional pulses may have the same preset output, as shown in FIG. 8. Alternatively, only the last pulse may have a different preset output, such as shown in FIG. 7. In any case, the amount of exposure which is substantially or approximately equal to the correct amount of exposure is attainable.

The plural pulse exposures may be effected by using the corresponding number of pulses having different preset outputs. When, in such case, the correct amount of exposure is denoted by $E_0$, the preset output of the first pulse $n_1$ is denoted by $E_1$, the preset output of the next pulse $n_2$ is denoted by $E_2$, and the preset output of the last pulse $n_3$ is denoted by $E_3$, it follows that:

$$E_0 = n_1 E_1 + n_2 E_2 + n_3 E_3$$

If $E_1 = \alpha_1 E_0$, $E_2 = \alpha_2 E_0$, and $E_3 = \alpha_3 E_0$, it follows that:

$$n_1\alpha_1 + n_2\alpha_2 + n_3\alpha_3 = 1$$

By adjusting the values of $\alpha_1$, $\alpha_2$ and $\alpha_3$ in the manner that the value of "$n_1 + n_2 + n_3$" is made small, the exposure time can be shortened while the correct amount of exposure is ensured.

Similarly to the FIG. 1 embodiment, the present invention with respect to the FIG. 3 embodiment is not limited to the lens projection reduction type exposure apparatus, but is also applicable to a mirror projection type exposure apparatus, a contact type exposure apparatus or a proximity type exposure apparatus.

In accordance with the present invention, as has hitherto been described, correct exposure is stably attainable with the use of a pulsed laser beam such as an excimer laser beam, in spite of substantial fluctuation in the output of each pulse.

FIGS. 9 and 10 show projection type and proximity type exposure apparatuses, respectively, to which the present invention is also applied. In FIGS. 9 and 10, corresponding elements are shown with the same reference numerals.

In FIG. 9, the exposure apparatus includes a light source 101 such as an excimer laser adapted to intermittently emit an exposing beam, an optical unit 102 for introducing the light beam emitted from the light source 101, a flat mirror 103 for deflecting the light beam introduced by the optical unit 102, and a projection lens 105 for transferring the pattern of a mask 104 onto a wafer 106 positioned on a pattern transfer plane. The exposure apparatus further includes a light measuring device 107 such as an integrating exposure meter for measuring the energy of the pulsed light. The measuring device 107 is arranged to receive pulses of light emitted from the light source 101 and transmitted through a semi-transmitting portion formed in the flat mirror 103 to monitor the quantity of pulsed light. In response to the reception of light, the measuring device 107 produces an output signal which is supplied to a pulse energy controlling unit 108. In accordance with the output signal supplied from the measuring device 107, the control unit 108 controls the light source 101 so that an appropriate pulse energy is emitted therefrom.

Since the FIG. 10 embodiment has substantially the same structure as does the FIG. 9 embodiment except that it is of proximity type as compared with the projection type of the FIG. 9 embodiment, a further description of the FIG. 10 structure will be omitted here merely for the sake of simplicity of explanation.

Control of the amount of exposure according to the present invention will now be described with reference to FIGS. 11 and 12.

Briefly, according to the present invention, exposure of one shot is effected by a combination of a primary or coarse exposure and a secondary or fine exposure. At least two pulses emitted from the light source 101 are used for the coarse and fine exposures. The coarse exposure is adapted to provide an amount of exposure which is smaller than a correct exposure amount, while the fine exposure is adapted to provide an amount of exposure which is much less than that provided by the coarse exposure. FIG. 11 shows an example of two-pulse exposure, while FIG. 12 shows an example of four-pulse exposure. For the sake of best understanding of the present invention, description will be made first to the FIG. 11 example of two-pulse exposure.

Upon exposure of one shot, as is shown in FIG. 11, the primary or coarse exposure is first effected with one pulse emitted from the light source 101 and having a pulse energy $E_1$ which is approx. 80-90% of an energy $E_0$, necessary for providing a correct exposure amount. Preferably, the proportion or magnitude of the pulse energy $E_1$ is selected while taking into account that the pulse energy to be provided by the light source fluctuates in the range of ±5%, as described in the foregoing.

The pulse energy $E_1$ is detected by the measuring device 107. Actually, the magnitude of the pulse energy $E_1$ is calculated out on the basis of the portion of the pulse energy $E_1$ transmitted through the flat mirror 103 and of the transmitting factor of the flat mirror 103. After the magnitude of the pulse energy $E_1$ is detected, the difference between the correct exposure energy $E_0$ and the pulse energy $E_1$ is detected by the control unit 108. On the basis of the thus detected difference, the control unit 108 controls the light source 101, such that a second pulse for the fine exposure and having a pulse energy $E_2$ corresponding to the differential energy $E_0-E_1$ is emitted from the light source 101. In the magnitude relation, the pulse energy $E_2$ is smaller than the pulse energy $E_1$ which is smaller than the correct exposure energy $E_0$.

The adjustment of the pulse energy $E_2$ is effected in the FIG. 9 or 10 embodiments by controlling the output of the light source 101. The pulse energy $E_2$ may however be controlled by means of an ND filter or a diaphragm mechanism inserted into the optical path of the light source 1.

The combination of coarse and fine exposure as described in the foregoing assures regular and stable exposure for every shot of exposure.

More specifically, the pulse energy $E_2$ for the fine exposure is much less than the correct exposure energy $E_0$. This means that the absolute deviation, caused by the ±5% fluctuation, in the actually produced pulse energy $E_2$ is extremely small as compared with the magnitude of the correct exposure energy $E_0$. Therefore, the total amount of pulse energies $E_1+E_2$ can be very close to the correct exposure energy $E_0$, even if the pulse energy $E_2$ contains, e.g., ±5% fluctuation. Thus, the present invention stably assures the amount of exposure which is equal to or substantially equal to the correct exposure amount for every shot of exposure.

This will be best understood in comparison with the effects of ±5% fluctuation in the one-shot/one-pulse exposure wherein the exposure of each shot is effected by one pulse.

In the one-shot/one-pulse exposure, the fluctuation of, e.g. +5% in the pulse output would directly cause +5% over-exposure as compared with the correct exposure energy $E_0$. The absolute amount of the excess +5% of the correct exposure energy $E_0$ is substantially greater than the absolute amount of the ±5% deviation of the pulse energy $E_2$.

In order to positively establish the relation that the pulse energy $E_2$ is much less than the correct exposure energy $E_0$, the magnitude of the pulse energy $E_1$ for the coarse exposure is preferably determined so as to satisfy the relation:

$$E_2 < < E_1 < E_0.$$

In the combined coarse and fine exposure according to the present invention, the number of pulse exposures is in fact larger than that of the one-shot/one-pulse exposure. Since, however, the pulse emission time (the duration of each pulse) is of the order of 0.01 sec. as described in the foregoing and also since the number of pulses for the coarse and fine exposures is held minimum (two in the FIG. 11 example), the exposure time is very short so that a high throughput can be maintained.

Figure 4:
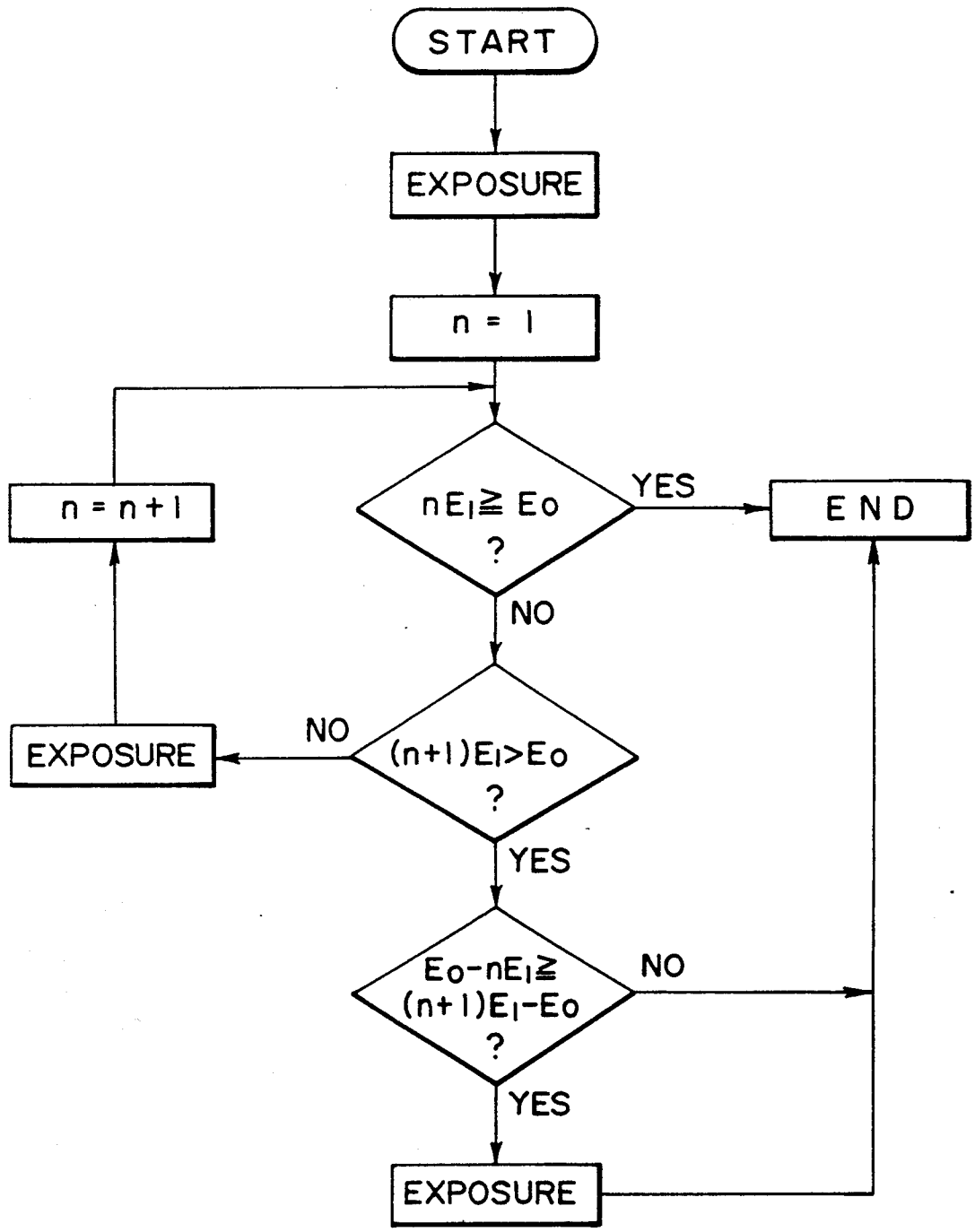
FIG. 4 is a flow chart showing an example of control for the amount of exposure in the exposure apparatus of FIG. 3.

If the resist material on the wafer requires a large amount of exposure energy to achieve the correct exposure, the primary or coarse exposure is effected by a plural number of pulse exposures (e.g. three such as shown in FIG. 4) through a corresponding number of pulses each having a pulse energy $E_1$. After the plural number of pulse exposures for the coarse exposure are completed, the fine exposure is effected with a pulse energy $E_1+E_1+E_1+E_2'$ is within a tolerable range of the correct exposure energy $E_0'$, e.g. within ±3%.

In this manner, a minimum number of pulse exposures is appropriately selected in accordance with the magnitude of correct exposure energy, while the magnitude relation between the pulse energies for the coarse and fine exposures is determined such that the amount of exposure to be provided by the fine exposure is much less than that to be provided by the coarse exposure. By this, the amount of exposure can be controlled precisely and stably, and a high throughput is assured.

The pulse-oscillation type laser may, of course, be replaced by a continuous emission type laser. In such case, suitable chopper means such as a shutter, an ND filter, etc. may be used to repeatedly interrupt the light from the source, whereby substantially the same effects are attainable as in the case of the pulsed laser beam.

FIG. 13 shows a step-and-repeat type exposure apparatus, called a stepper, to which the present invention is applied.

As is shown in FIG. 13, the exposure apparatus includes a light source 101, an optical unit 102, a flat mirror 103, a measuring device 107 and a control unit 108 all of which are substantially the same as the corresponding elements, respectively, of the FIG. 9 embodiment. The exposure apparatus of the FIG. 13 embodiment further includes a reduction projection optical system 105' disposed between a mask 104 and a wafer 106. The wafer 106 is carried by a carriage 109 which is adapted to be continuously moved by an unshown drive source.

In the exposure operation, the light source 101 such as an excimer laser intermittently emits the exposure light. Simultaneously therewith, the carriage 109 is continuously moved by the unshown drive source at a speed which is co-ordinated with the emission of pulses from the light source 101. The continuous movement of the carriage 109 has an advantage over the conventional stepwise movement in a traditional step-and-repeat system, because the former is effective to minimize any time loss owing to the repetition of stop and re-start of movement of the carriage 109. Consequently, the throughput of the apparatus is increased.

FIG. 14 shows an example of the exposure sequence employed in the FIG. 13 embodiment.

In FIG. 14, reference characters $C_1$-$C_5$ denote rows, respectively, each containing a plurality of chip areas. In this embodiment, each row contains three or five chip areas. In each of the chip areas shown in FIG. 14, the dot designates irradiation by a laser pulse or pulses for the coarse exposure, while the circle designates irradiation by a laser pulse for the fine exposure.

For the sake of best understanding of the present invention, description will be made to two-pulse exposure for the combined coarse and fine exposure, i.e. the combination of coarse exposure by one pulse with fine exposure by one pulse.

If the exposure sequence is arranged such that the coarse exposure and the subsequent fine exposure are effected relative to one chip area and thereafter the wafer is stepped to effect the coarse and fine exposures relative to the succeeding chip area, there would be a substantial time loss due to the repetition of stop and re-start of movement of the carriage 109 as described in the foregoing. In view of this, the exposure sequence according to the present embodiment is arranged such that a plurality of chip areas form one group (e.g. $C_1$) and the coarse exposures are successively and sequentially effected to the chip areas in the one group and thereafter the fine exposures are successively and sequentially effected to the chip areas in that one group.

This exposure process will hereinafter be referred to as "complete step" or "one complete step". After the complete step relative to one of the groups is finished, the complete step is repeated relative to each of the remaining groups.

More specifically, as shown in FIG. 14, successive and sequential coarse exposures denoted by dots are first effected relative to the chip areas in the row $C_1$ in the order designated by arrows. During these coarse exposures, the pulse energy applied to each of the chip areas is detected and the differential energy between the correct exposure energy and the thus detected pulse energy, with respect to each of the chip areas, is calculated and stored by the control unit 108. Subsequently, successive and sequential fine exposures as denoted by circles are effected relative to the chip areas in the row $C_1$ in the reverse order as designated by arrows, with the pulse energies controlled by the control unit 108. By this operation, one complete step relative to the row $C_1$ is finished.

Subsequently, in the order as denoted by arrows shown in FIG. 14, successive coarse exposures and successive fine exposures are effected relative to the chip areas in each of the rows $C_2$-$C_5$, sequentially.

As described with reference to FIG. 11, the pulse energy for the coarse exposure relative to each of the chip areas is selected so that it is, e.g., approx. 80-90% of the correct exposure energy, while the pulse energy for the fine exposure is controlled to provide the remaining exposure energy. The selection or control of the pulse energy can be achieved by controlling the light source 101 through the control unit 108. The divided application of exposure energy as described above assures precise control of the amount of exposure. That is, according to the present invention, the fine exposure is effected by a pulse energy which is much less than the correct exposure energy. Therefore, any fluctuation of the pulse energy for the fine exposure will cause merely an absolute amount of deviation which is extremely small as compared with the magnitude of the correct exposure energy.

While, in the FIG. 14 example, the exposure of the entire wafer is completed by five complete steps, the five-step exposure may be replaced by one-step exposure, i.e. the combination of one complete series of successive coarse exposures with one complete series of successive fine exposures, such as shown in FIG. 15.

More specifically, if the stepper is provided with an alignment system of the off-axis type, coarse exposures are successively and sequentially effected relative to all the chip areas on the wafer, with the movement of the wafer being executed while relying on the precision of the laser interferometer in the alignment system. During these coarse exposures, each of the actually produced pulse energies is detected by the measuring device 107 and the magnitude of the pulse energy necessary for supplementing the coarse exposure relative to each of the chip areas is calculated and stored in the control unit 108. After all the coarse exposures are completed, fine exposures are successively and sequentially effected relative to all the chip areas on the wafer, with the pulse energy of each fine exposure being appropriately controlled in accordance with the magnitude of the pulse energy of the coarse exposure. With this arrangement, efficient exposure as well as regular and stable exposure are attainable.

While, in the FIG. 15 example, the fine exposures are effected in the same order as the coarse exposures, this may be reversed. Further, the off-axis alignment system may, of course, be replaced by TTL (through the lens) alignment system. Since the operation in such case is essentially the same as the FIG. 15 example, description thereof will be omitted here for the sake of simplicity of explanation.

In the examples of FIGS. 14 and 15, the coarse exposure may of coarse be effected by a plural number of pulse exposures.

While, in the foregoing embodiment, the present invention has been described with reference to exposure apparatus of projection type and proximity type, the invention is not limited thereto and also is applicable to a contact type exposure apparatus. In addition, the present invention is applicable to the control of exposure in a case where a pulse-oscillation type laser such as the excimer layer is employed as a light source for a recently developed resistless etching.

In accordance with the present invention, as has hitherto been described, the combined coarse and fine exposure assures precise and stable control of the amount of exposure while ensuring improvements in the throughput. Moreover, in a case where the invention is applied to a step-and-repeat type exposure apparatus, coarse exposures are successively and sequentially effected relative to a plurality of chip areas and thereafter fine exposures are successively and sequentially effected relative to the same chip areas. By this, the stage carrying thereon the wafer can be moved continuously without repetition of stoppage for every chip area, whereby the time loss due to the repetition of stop and re-start is removed. Thus, the throughput is further increased.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for forming a circuit pattern on a wafer, said apparatus comprising:
   a mask bearing the circuit pattern;
   a pulsed laser for illuminating the mask with a plurality of pulses in a single exposure, each pulse providing an amount of light smaller than an amount of light required for correct exposure of the wafer;
   means for measuring the total amount of light in a first portion of the exposure and for comparing the measured amount of light with the required amount of light; and
   means for controlling the amount of light provided in a second portion of the exposure by controlling pulse height of the laser pulses so that the single exposure substantially provides the total required amount of light.

2. An apparatus according to claim 1, wherein the second portion consists of a single pulse.

3. An apparatus according to claim 1, wherein the first portion comprises a plurality of pulses.

4. An apparatus according to claim 3, further comprising pulse output presetting means for variably presetting the output of each of said pulses to be generated by said laser in said first portion at a value suitable for providing an amount of light smaller than the required amount of light.

5. An apparatus according to claim 4, wherein said pulse output presetting means is adapted to preset the same light output for each pulse.

6. An apparatus according to claim 5, wherein the laser is an excimer laser.

7. An apparatus according to claim 1, wherein the second portion consists of a plurality of pulses.

8. An apparatus according to claim 7, wherein said means for controlling the amount of light in the second portion of the exposure is adapted to preset, for at least the last one of said additional pulses, an output different from the preset output of each of said pulses in the first portion of the exposure.

9. An apparatus according to claim 1, wherein the pulse height of the laser pulses is controlled by controlling said pulsed laser.

10. An apparatus according to claim 1, further comprising an optical filter for controlling pulse height of the laser pulses.

11. A method of forming a circuit pattern on a wafer, said method comprising the steps of:
   forming on the wafer an image of a mask bearing the circuit pattern by illuminating the mask in a single exposure with a plurality of pulses from a pulsed laser, the exposure comprising a first portion and a second portion;
   comparing the total amount of light in the first portion with the total amount of light required for correct exposure of the wafer; and
   controlling the amount of light in the second portion by controlling pulse height of the laser pulses so that the single exposure substantially provides the total required amount of light.

12. A method according to claim 11, wherein the second portion consists of a single pulse.

13. A method according to claim 11, wherein the second portion consists of a plurality of pulses.

14. A method according to claim 13, wherein at least the last pulse of the second portion of the pulse exposure has a preset output different from that of each of the pulses in the first portion of the pulse exposure.

15. A method according to claim 11, wherein the first portion comprises a plurality of pulses.

16. A method according to claim 15, wherein said pulses in said first portion have preset outputs substantially equal to each other.

17. A method according to claim 16, wherein the pulsed laser beam comprises a laser beam provided by an excimer laser.

18. A method according to claim 11, further comprising controlling the pulsed laser to control pulse height of the laser pulses.

19. A method according to claim 11, further comprising controlling pulse height of the laser pulses by an optical filter.

20. A method of forming a circuit pattern on a wafer by transferring the pattern from a mask to the wafer, said method comprising the steps of:
   illuminating the mask in a single exposure by a predetermined number of pulses from a pulsed laser, each laser pulse providing an amount of light less than that required for correct exposure of the wafer; and
   carrying out said exposure without controlling said exposure on the basis of monitoring the amount of light provided by the pulses from the laser during said exposure.

21. A method according to claim 20, in which all of said laser pulses in said single exposure illuminating steps are substantially the same.

22. A method according to claim 20, wherein differing amounts of light are provided in the laser pulses in said single exposure of said illuminating step.

23. A method according to claims 20, 21 or 22, wherein the pattern is projected from the mask to the wafer during said illuminating step by an optical system.

24. A method according to claims 20, 21 or 22, wherein said laser is an excimer laser.

25. Apparatus for forming a circuit pattern on a mask onto a wafer, said apparatus comprising:
   means for transferring the circuit pattern from the mask to the wafer, said transferring means comprising a pulsed laser for illuminating the mask; and
   control means for causing said pulsed laser to illuminate the mask in a single exposure with a predetermined number of pulses from said laser, each said pulse providing an amount of light less than that required for correct exposure of the wafer, said control means being adjustable for varying the amount of light in the pulses and being arranged to operate without controlling said exposure on the basis of monitoring the amount of light provided by the pulses from said laser during said exposure.

26. Apparatus according to claim 25, wherein said control means is operable such that all of said pulses in said single exposure are substantially the same.

27. Apparatus according to claim 25, wherein said control means is operable such that different pulses in said single exposure may provide different amounts of light.

28. Apparatus according to claims 25, 26 or 22, wherein said transferring means includes optical means for projecting an image of the circuit pattern from the mask to the wafer.

29. Apparatus according to claims 25, 26 or 27, wherein said laser is an excimer laser.

30. Apparatus for forming a circuit pattern on a mask onto a wafer, comprising:
   means for transferring the pattern from the mask bearing the circuit pattern to the wafer, said transferring means including a pulsed laser;
   means for causing said pulsed laser to illuminate the mask with a plurality of laser pulses in a single exposure, each pulse providing an amount of light less than that required for the correct exposure of the wafer;
   means for measuring the amount of light in a first portion of the exposure containing at least one laser pulse;
   means for comparing the measured amount of light with an amount corresponding to that required for correct exposure for determining the remainder of the amount of light required; and
   means for providing said remainder of the amount of light in a second portion of the exposure without performing any further comparing operation for the control of said second portion of said exposure, so that the first and second portions of the single exposure together provide substantially the correct amount of light for exposure.

31. Apparatus according to claim 30, wherein said pulsed laser is an excimer laser.

32. Apparatus according to claims 30 or 31, wherein said transferring means includes an optical system for projecting an image of the pattern on the mask onto the wafer, 33. Apparatus according to claims 30 or 31, wherein said remainder providing means is arranged so that the second portion of the exposure comprises a plurality of laser pulses.

34. Apparatus according to claim 33, wherein said remainder providing means is arranged so that each laser pulse in the second portion of the exposure contains less light than that of each laser pulse in the first portion.

35. Apparatus according to claim 33, wherein said remainder providing means is arranged so that the laser pulses in the second portion of the exposure contain the same amount of light as each other.

36. Apparatus according to claim 33, wherein said remainder providing means is arranged so that the last laser pulse in the second portion of the exposure contains less light than that of each other laser pulse in the second portion.

37. A method of forming a circuit pattern on a mask onto a wafer, comprising:
   illuminating the mask bearing the circuit pattern with a plurality of pulses from a pulsed laser in a single exposure for transferring the pattern from the mask to the wafer, each laser pulse providing an amount of light less than that required for the correct exposure of the wafer;
   measuring the amount of light in a first portion of the exposure containing at least one laser pulse;
   comparing the measured amount of light with an amount of light corresponding to that required for correct exposure for determining the remainder of the amount of light required; and
   providing said remainder of the amount of light in a second portion of the exposure without performing any further comparing operation for the control of said second portion of said exposure, so that the first and second portions of the single exposure together provided substantially the correct amount of light for exposure.

38. A method according to claim 37, wherein said laser pulses are obtained from an excimer laser.

39. A method according to claims 37 or 38, wherein an image of the pattern on the mask is formed on the wafer by means of an optical system.

40. A method according to claims 37 or 38, wherein the second portion of the exposure comprises a plurality of laser pulses.

41. A method according to claim 40, in which laser pulse in the second portion of the exposure contains less light than that of each laser pulse in the first portion.

42. A method according to claim 40, in which the laser pulses in the second portion of the exposure contain the same amount of light as each other.

43. A method according to claim 40, in which the last of the laser pulses in the second portion of the exposure contains less light than that of each other laser pulse in the second portion.

44. A method of forming a circuit pattern on a mask onto a wafer in which the pattern is transferred from a mask to the wafer, comprising the steps of:
   illuminating the mask in a single exposure by a number of pulses from a pulsed laser, each pulse providing an amount of light less than that required for correct exposure of the wafer, said exposure comprising a first portion containing a predetermined number of laser pulses and a second portion which is controlled so that the first and second portions together provide the required amount of light for exposure.

45. A method according to claim 44, in which all of said laser pulses in said single exposure are substantially the same.

46. A method according to claim 44, wherein differing amounts of light are provided in laser pulses in said single exposure.

47. A method according to claims 44, 45 or 46, wherein the pattern is projected from the mask to the wafer by an optical system.

48. A method according to claims 44, 45 or 46, wherein said laser is an excimer laser.

49. Apparatus for forming a circuit pattern on a mask onto a wafer, said apparatus comprising:
   means for transferring the circuit pattern from a mask to the wafer, said transferring means comprising a pulsed laser for illuminating the mask; and
   control means for causing the mask to be illuminated in a single exposure with a number of laser pulses from said laser, each pulse providing an amount of light less than that required for correct exposure of the wafer, said control means being operable to control said transferring means to perform said exposure in first and second portions, said first portion containing a predetermined number of laser pulses and said second portion being controlled so that the first and second portions together provide the required amount of light.

50. Apparatus according to claim 49, wherein said control means is operable such that all of said laser pulses in said single exposure are substantially the same.

51. Apparatus according to claim 49, wherein said control means is operable such the different laser pulses in said single exposure may provide different amounts of light.

52. Apparatus according to claims 49, 50 or 51, wherein said transferring means includes optical means for projecting an image of the circuit pattern from the mask to the wafer.

53. Apparatus according to claims 49, 50 or 51, wherein said laser is an excimer laser.

54. A method of performing exposure with intermittent light, comprising:
   sequentially effecting a coarse exposure of each of a plurality of areas to be exposed, each of said coarse exposures providing an amount of light smaller than the required amount for the area to be exposed; and thereafter
   sequentially effecting a fine exposure of each of the areas to be exposed, each of said fine exposures providing an amount of light which is smaller than that provided by said coarse exposure for the area to be exposed and which supplements said coarse exposure so that the total amount of light provided by said coarse exposure and said fine exposure is substantially equal to the required exposure.

55. A method according to claim 54, wherein a plurality of exposures are effected for said coarse exposure for each of the areas to be exposed.

56. A method according to claims 54 or 55, wherein the order in which the fine exposures are conducted relative to the areas to be exposed is the same as that of said coarse exposures.

57. A method according to claims 54 or 55, wherein the order in which the fine exposures are conducted relative to the areas to be exposed is opposite to that of said coarse exposures.

58. A method according to claims 54 or 55, wherein said areas are arranged in a plurality of rectilinear rows, both the coarse exposures and the fine exposures for each row being carried out before the coarse exposures and fine exposures for the next row.

59. A method according to claims 54 or 55, wherein the intermittent light is provided by an excimer laser.

60. An exposure apparatus for exposing a wafer to a pattern on a mask, comprising:
   means for producing intermittent light;
   a projection optical system for transferring the pattern on the mask onto the wafer;
   carriage means for carrying thereon the wafer, said carriage means being movable to transfer the pattern of the mask onto a plurality of areas on the wafer;
   measuring means for integratingly detecting an amount of exposure on each of said areas on the wafer; and
   controlling means for controlling said light producing means to effect sequentially a coarse exposure of each of said areas on the wafer and then sequentially a fine exposure of each of said areas, said control means controlling said coarse exposure so that it provides an amount of light smaller than the required correct exposure for each of said areas on the wafer, said control means also controlling said fine exposure so that it provides an amount of light smaller than that provided by said coarse exposure relative to the corresponding one of said areas on the wafer and so that the total amount of light provided by said coarse exposure and said fine exposure relative to the corresponding one of the areas on the wafer is substantially equal to the required exposure.

61. An apparatus according to claim 60, wherein said means for producing intermittent light comprises an excimer laser.

62. An apparatus according to claims 60 or 61, wherein said carriage means is movable continuously.

63. An apparatus according to claims 60 or 61, wherein the integrated amount of light detected by said detecting means on each of the areas of the wafer provided for said coarse exposure is memorized by said control means, and said fine exposure is controlled by said controls means in accordance with the memorized amount of light provided for said coarse exposure.

64. Apparatus according to claims 60 or 61, wherein said apparatus is arranged for transferring the pattern of the mask onto a plurality of said areas arranged in a plurality of rectilinear rows, said apparatus being further arranged to perform both said coarse and said fine exposures in each said row before performing the coarse and fine exposures for the next row.

65. Apparatus for forming a circuit pattern on a mask onto a wafer, comprising:
   means for transferring the pattern from the mask bearing the circuit pattern to the wafer, said transferring means including a pulsed laser;
   means for causing the mask to be illuminated with a plurality of pulses from the laser in a single exposure, each laser pulse providing an amount of light in a first portion of the exposure containing at least one laser pulse;
   means for measuring the amount of light in a first portion of the exposure containing at least one laser pulse;
   means for comparing the measured amount of light with an amount of light corresponding to that required for correct exposure for determining the remainder of the amount of light required; and
   means for providing said remainder of the amount of light required in a second portion of the exposure without performing any further comparing operation for the control of said second portion of said exposure, so that the first and second portions of the single exposure together provide substantially the correct amount of light, said second portion comprising a laser pulse providing an amount of light less than that of each laser pulse in the first portion.

66. Apparatus to claim 65, wherein said pulsed laser is an excimer laser.

67. Apparatus according to claims 65 or 66, wherein said transferring means includes an optical system for projection an image of the pattern on the mask onto the wafer.

68. Apparatus according to claims 65 or 66, wherein said remainder providing means is arranged so that the second portion of the exposure consists of a single said laser pulse.

69. A method of forming a circuit pattern on a mask onto a wafer, comprising the steps of:
   illuminating the mask bearing the circuit pattern with a plurality of pulses from a pulsed laser in a single exposure for transferring the pattern from the mask to the wafer, each laser pulse providing an amount of light less than that required for the correct exposure of the wafer;
   measuring the amount of light in a first portion of the exposure containing at least one laser pulse;
   comparing the measured amount of light with an amount of light corresponding to that required for correct exposure for determining the remainder of the amount of light required; and
   providing said remainder of the amount of light required in a second portion of the exposure without performing any further comparing operation for the control of said second portion of said exposure, so that the first and second portions of the single exposure together provide substantially the correct amount of light, said second portion comprising a laser pulse providing an amount of light less than that of each laser pulse in the first portion.

70. A method according to claim 69, wherein said pulses are obtained from an excimer laser.

71. A method according to claims 69 or 70, wherein an image of the pattern on the mask is formed on the wafer by means of an optical system.

72. A method according to claims 67 or 70, in which the second portion of the exposure consists of a single said laser pulse.

73. A semiconductor device manufacturing exposure method comprising the steps of:
   exposing a predetermined zone of a wafer to a pattern of a mask with pulses of an excimer laser passed through an illumination optical system, for transferring the mask to the wafer, wherein each pulse has a light quantity smaller than a quantity of correct exposure for the predetermined zone, and wherein the exposure zone includes a first portion containing at least one pulse and a second portion containing at least one pulse;
   discriminating the relationship between the total quantity of exposure in the first portion and the quantity of correct exposure for the predetermined zone; and controlling pulse height of the at least one pulse in the second portion of the exposure zone to control the total quantity of exposure in the second portion, so that the predetermined zone is exposed in the first and second portions with a quantity of exposure substantially equal to the quantity of correct exposure.

74. A method according to claim 73, wherein the last pulse in the second portion of the exposure zone has a height different from that of each pulse in the first portion of the exposure zone.

75. In a semiconductor device manufacturing exposure method for exposing a predetermined zone of a wafer to a pattern of a mask with pulses of an excimer laser passed through an illuminating optical system, for transferring the mask pattern to the wafer, wherein each pulse has a light quantity smaller than a quantity of correct exposure for the predetermined zone, the improvement comprising:

exposing the predetermined zone of the wafer with a fixed number of pulses from the excimer laser, for the correct exposure; and effecting the exposure of the predetermined zone free from monitoring a light quantity during the exposure with the pulses.

76. A semiconductor device manufacturing exposure method comprising the steps of:

exposing a predetermined zone of a wafer to a pattern of a mask with pulses of an excimer laser passed through an illumination optical system, for transferring the mask pattern to the wafer, wherein each pulse has a light quantity smaller than a quantity of correct exposure for the predetermined zone, and wherein the exposure zone includes a first portion containing at least two pulses and a second portion containing at least one pulse;

controlling pulse height of the at least one pulse in the second portion of the exposure zone to control the total quantity of exposure in the second portion, so that the predetermined zone is exposed in the first and second portions with a quantity of exposure substantially equal to the quantity of correct exposure.

77. A method according to claim 76, wherein the last pulse in the second portion of the exposure zone has a height different from that of each pulse in the first portion of the exposure zone.

* * * * *

UNITED STATES PATENT AND TRADEMARK OFFICE
CERTIFICATE OF CORRECTION

PATENT NO. : 5,171,965
DATED : December 15, 1992
INVENTOR(S) : Akiyoshi Suzuki, et al.

It is certified that error appears in the above-indentified patent and that said Letters Patent is hereby corrected as shown below:

ON THE COVER PAGE

In the title, and also in column 1, line 2,

"EXPOSURE METHOD AND APPARATUS" should read --PULSE EXPOSURE METHOD AND APPARATUS COMPENSATING FOR UNDER EXPOSURE OF PULSE FLUCTUATION--.

[56] UNDER FOREIGN APPLICATION PRIORITY DATA

The following should be inserted:
--Feb. 14, 1984 [JP] Japan ... 59-24282
  Feb. 14, 1984 [JP] Japan ... 59-24283--.

BENEATH THE ABSTRACT

"4 Drawing Sheets" should read --7 Drawing Sheets--.

IN THE DRAWINGS

FIGS. 9-15, as set forth on the three attached sheets, should be inserted immediately following FIG. 8.

UNITED STATES PATENT AND TRADEMARK OFFICE
CERTIFICATE OF CORRECTION

PATENT NO. : 5,171,965
DATED : December 15, 1992
INVENTOR(S) : Akiyoshi Suzuki, et al.

Page 2 of 6

It is certified that error appears in the above-indentified patent and that said Letters Patent is hereby corrected as shown below:

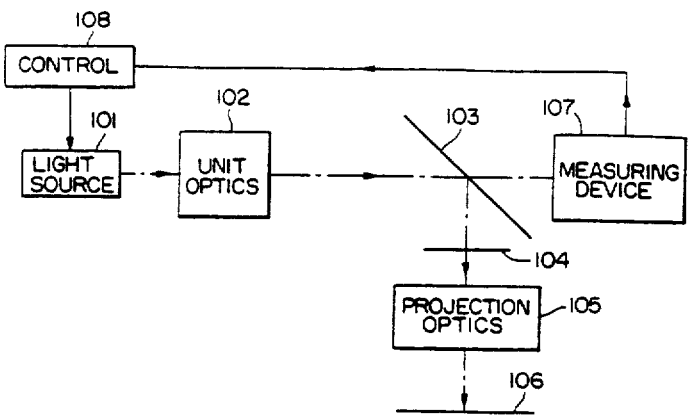

FIG. 9

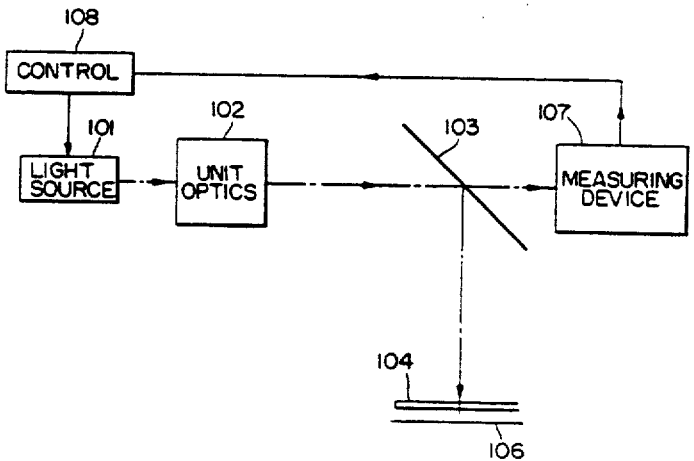

FIG. 10

UNITED STATES PATENT AND TRADEMARK OFFICE
CERTIFICATE OF CORRECTION

PATENT NO. : 5,171,965
DATED : December 15, 1992
INVENTOR(S) : Akiyoshi Suzuki et al It is certified that error appears in the above-indentified patent and that said Letters Patent is hereby corrected as shown below:

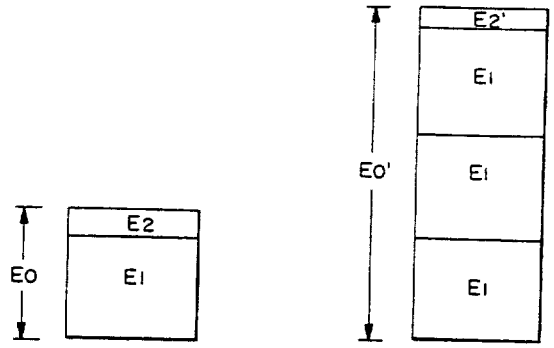

FIG. 11    FIG. 12

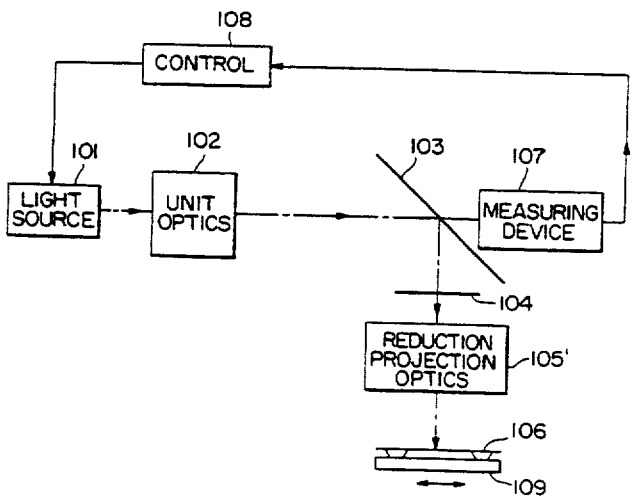

FIG. 13

UNITED STATES PATENT AND TRADEMARK OFFICE
CERTIFICATE OF CORRECTION

PATENT NO. : 5,171,965                    Page 4 of 6
DATED      : December 15, 1992
INVENTOR(S): Akiyoshi Suzuki, et al.

It is certified that error appears in the above-indentified patent and that said Letters Patent is hereby corrected as shown below:

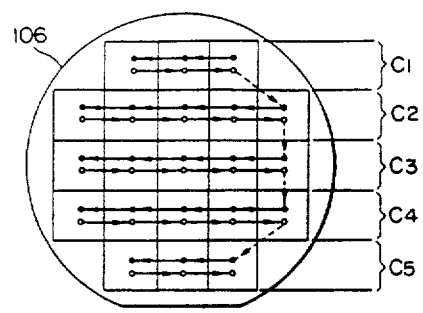

FIG. 14

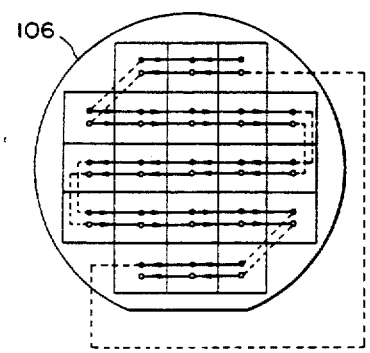

FIG. 15

UNITED STATES PATENT AND TRADEMARK OFFICE
CERTIFICATE OF CORRECTION

PATENT NO. : 5,171,965
DATED : December 15, 1992
INVENTOR(S) : Akiyoshi Suzuki, et al.

It is certified that error appears in the above-indentified patent and that said Letters Patent is hereby corrected as shown below:

IN THE DISCLOSURE

COLUMN 2

Line 56, "FIGS. 5-8" should read --FIGS. 5-8 are--.

COLUMN 6

Line 30, " "under or under-exposure". " should read --"under-exposure".--.

COLUMN 14

Line 31, "22," should read --27,--; and
Line 66, "wafer," should read --wafer.--.

COLUMN 16

Line 32, "such" should read --such that--.

UNITED STATES PATENT AND TRADEMARK OFFICE
CERTIFICATE OF CORRECTION

PATENT NO. : 5,171,965
DATED : December 15, 1992
INVENTOR(S) : Akiyoshi Suzuki, et al.

It is certified that error appears in the above-indentified patent and that said Letters Patent is hereby corrected as shown below:

COLUMN 18

Line 17, "projection" should read --projecting--; and
    Line 51, "claims 67" should read --claims 69--.

COLUMN 20

Line 5, "of." should read --of:--.

Signed and Sealed this

Thirtieth Day of November, 1993

Attest:

BRUCE LEHMAN

Attesting Officer     Commissioner of Patents and Trademarks